United States Patent [19]
Noda

[11] Patent Number: 5,826,056
[45] Date of Patent: Oct. 20, 1998

[54] SYNCHRONOUS MEMORY DEVICE AND METHOD OF READING DATA FROM SAME

[75] Inventor: Kazuyuki Noda, Tokyo, Japan

[73] Assignees: Mitsubishi Denki Kabushiki Kaisha; Mitsubishi Electric Engineering Co., Ltd., both of Tokyo, Japan

[21] Appl. No.: 769,781

[22] Filed: Dec. 19, 1996

[30] Foreign Application Priority Data

Jul. 23, 1996 [JP] Japan .................................. 8-193395

[51] Int. Cl.$^6$ .................................................. G06F 13/00
[52] U.S. Cl. .......................... 395/494; 395/432; 395/481; 365/205; 365/230.06; 364/DIG. 1
[58] Field of Search .................. 395/432, 481, 395/494; 365/205, 230.06

[56] References Cited

U.S. PATENT DOCUMENTS

| | | | |
|---|---|---|---|
| 4,698,788 | 10/1987 | Flannagan et al. | 365/205 |
| 5,398,047 | 3/1995 | Nara et al. | 345/190 |
| 5,400,274 | 3/1995 | Jones et al. | 365/63 |
| 5,406,526 | 4/1995 | Sugibayashi et al. | 365/230.03 |
| 5,596,539 | 1/1997 | Passow et al. | 365/210 |
| 5,604,697 | 2/1997 | Takahashi et al. | 365/182 |
| 5,629,898 | 5/1997 | Idei et al. | 365/222 |

FOREIGN PATENT DOCUMENTS

59-72699  4/1984  Japan .

*Primary Examiner*—Frank J. Asta
*Attorney, Agent, or Firm*—Oblon, Spivak McClelland, Maier & Neustadt, P.C.

[57] ABSTRACT

The access time required to read data from a synchronous memory device is shortened. Drivers (31) drive sub-word lines (30) connected to the gates of pass transistors in memory cells (1). An address decoder (34) selectively activates main word lines (32) prior to the falling of a clock (T). The drivers (31) having a first input terminal connected to the activated main word line (32) activate the main word line (32) at the time when the clock (T) at their second input terminal falls.

6 Claims, 8 Drawing Sheets

SYNCHRONOUS MEMORY DEVICE AND METHOD OF READING DATA FROM SAME

BACKGROUND OF THE INVENTION

1. Field of the Invention

The present invention relates to a synchronous memory device operating in synchronism with a clock and a method of reading data from the synchronous memory device. More particularly, the invention relates to a synchronous RAM for shortening an access time required to read data and a method of reading data from the same.

2. Description of the Background Art

Figure 10:
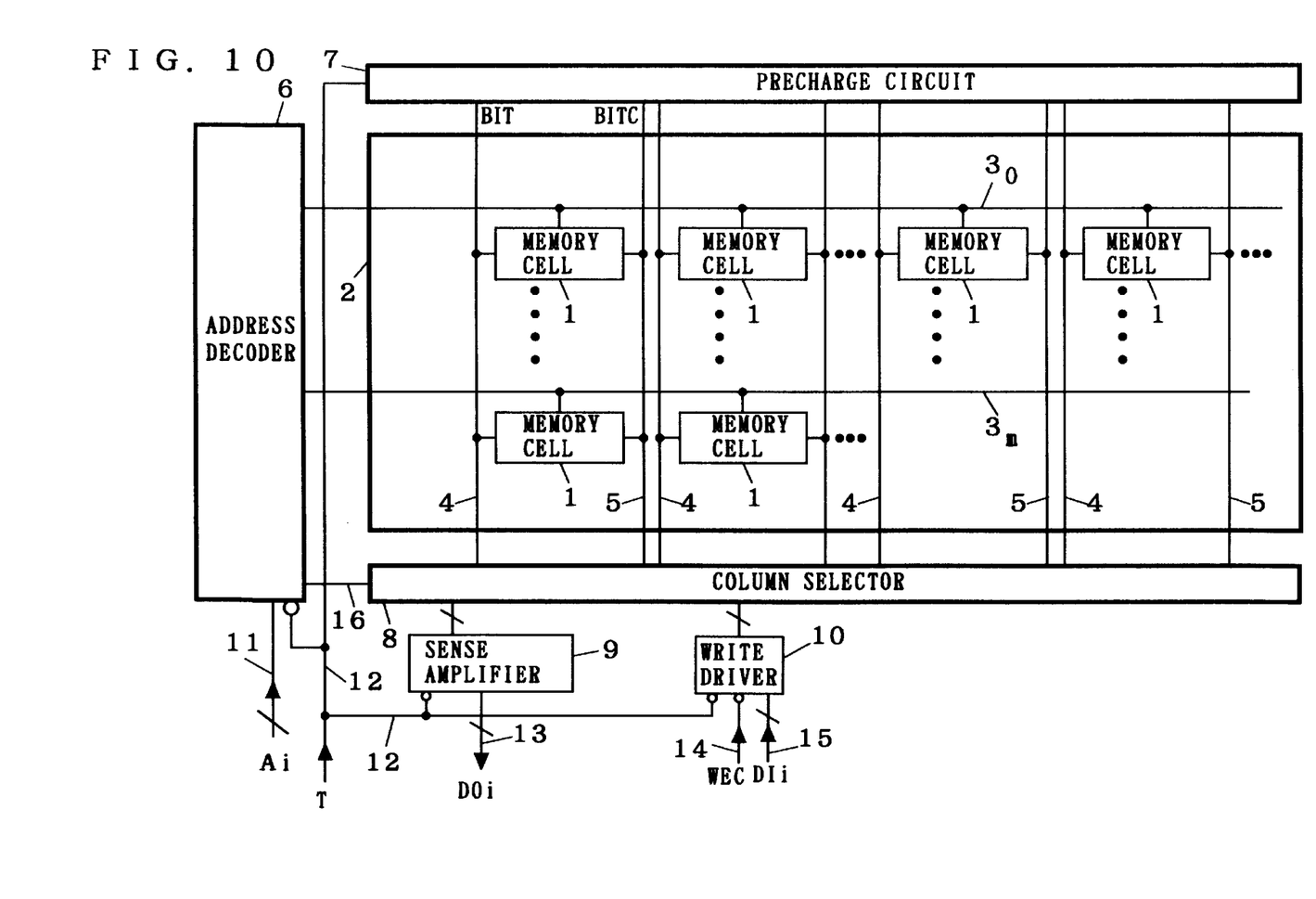
FIG. 10 is a block diagram of a conventional synchronous RAM.

An example of a synchronous memory device including a synchronous RAM is now discussed. FIG. 10 is a block diagram showing principal portions of a conventional synchronous RAM. In FIG. 10, the reference numeral 1 designates memory cells each for storing 1-bit data therein; 2 designates a memory plane which is an area wherein a plurality of memory cells 1 are arranged; the reference characters $3_0$ to $3_m$ designate word lines connected to selecting pass transistors provided in the memory cells 1; 4 and 5 designate bit lines connected to the memory cells 1 and used for transmitting data; 6 designates an address decoder for decoding an address signal Ai for selection of the word lines $3_0$ to $3_m$; 7 designates a precharge circuit for precharging the bit lines 4 and 5; 8 designates a column selector for selecting a column to be written or read among the columns of the memory cells 1 constituting the memory plane 2; 9 designates a sense amplifier for reading data from the memory cell 1 selected by the address decoder 6 and the column selector 8; 10 designates a write driver for writing data into the memory cell 1 selected by the address decoder 6 and the column selector 8; 11 designates an address bus for transmitting the address signal Ai; 12 designates a signal line for transmitting a clock T to the address decoder 6, the precharge circuit 7, the sense amplifier 9, and the write driver 10; 13 designates an address bus for outputting data DOi read by the sense amplifier 9; 14 designates a signal line for transmitting a write enable signal WEC; and 15 designates a data bus for transmitting data Dli to be written by the write driver 10.

Figure 11A:
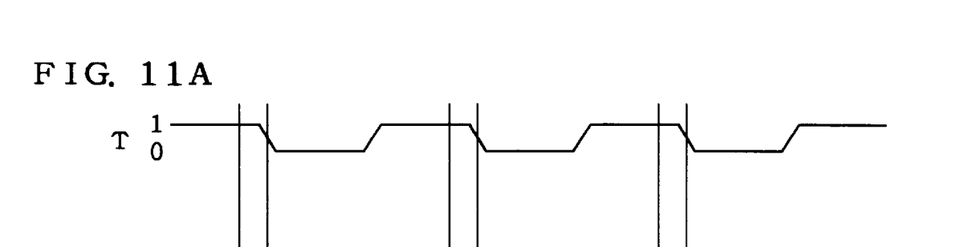
FIGS. 11A through 11C are a timing chart illustrating the operation of the synchronous RAM of FIG. 10.
Figure 11B:
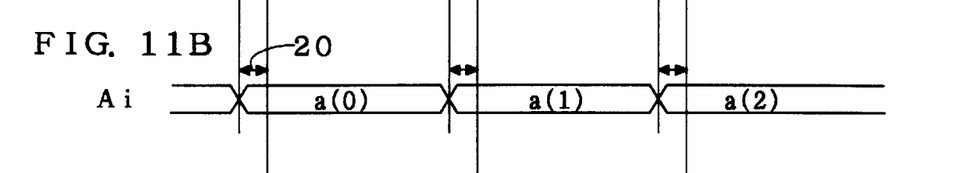
Figure 11C:
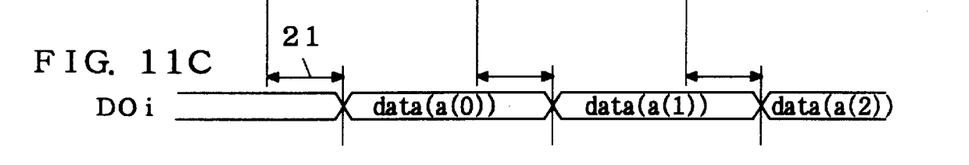

FIGS. 11A through 11C are a timing chart illustrating the read operation of the conventional synchronous RAM. FIG. 11A illustrates the clock T, FIG. 11B illustrates the address signal Ai, and FIG. 11C illustrates the data DOi. The precharge circuit 7 charges the bit lines 4 and 5 up to the high level while the clock T is "1" to set signals BIT and BITC to "1". When the clock T falls to "0", the address decoder 6 is enabled, and the address decoder 6 then decodes the address signal Ai to select one of the word lines $3_0$ to $3_m$. Input of the address signal Ai precedes the falling of the clock T by a setup time indicated by the arrows 20 of FIG. 11B.

One of the word lines $3_0$ to $3_m$ which is selected by the address decoder 6 goes high, and the data in the memory cells 1 in the row corresponding to the selected word line are outputted to the bit lines 4 and 5. The data DOi in one of the memory cells 1 in the row which is connected to the bit lines 4 and 5 selected by the column selector 8 are read.

An access time which is the time between the falling of the clock T and the reading of the data DOi is indicated by the arrows 21 of FIG. 11C. The access time includes the time required for the address decoder 6 to activate the word lines $3_0$ to $3_m$, time delay resulting from the memory cells 1, the time required for the column selector 8 to select the bit lines 4 and 5, and the operating time of the sense amplifier 9.

With the conventional synchronous RAM, an attempt to control the write operation for each bit changes the construction of the write driver 10, resulting in increased circuit size. This results from the need for a circuit in the write driver 10 for causing the memory cells 1 to intactly hold data for each bit.

The conventional synchronous memory device constructed as above described has been difficult to shorten the access time including the time required for the address decoder 6 to activate the word lines $3_0$ to $3_m$.

Additionally, the attempt to control the write operation for each group of bit lines classified has resulted in increased circuit size.

SUMMARY OF THE INVENTION

According to a first aspect of the present invention, a synchronous memory device comprises: an address decoder for decoding an address signal prior to a predetermined change in at least one clock; a plurality of main word lines selectively activated in accordance with a result of decoding of the address signal by the address decoder; a plurality of sub-word lines corresponding to the plurality of main word lines and connected to a plurality of memory cells for controlling reading of data from the plurality of memory cells; and a plurality of drivers corresponding respectively to the plurality of sub-word lines for activating corresponding ones of the plurality of sub-word lines in response to the predetermined change in the at least one clock when a corresponding one of the plurality of main word lines is active.

Preferably, according to a second aspect of the present invention, the plurality of sub-word lines include first and second sub-word lines permitted to be activated simultaneously when a corresponding one of the plurality of main word lines is active; and the plurality of drivers include first drivers for activating the first sub-word lines in response to the predetermined change in the at least one clock when the first drivers are operable in response to a first control signal and a corresponding one of the plurality of main word lines is active, and second drivers for activating the second sub-word lines in response to the predetermined change in the at least one clock when the second drivers are operable in response to a second control signal and a corresponding one of the plurality of main word lines is active.

Preferably, according to a third aspect of the present invention, the at least one clock includes first and second clocks different from each other; the plurality of sub-word lines includes first and second sub-word lines permitted to be activated simultaneously when a corresponding one of the plurality of main word lines is activated; and the plurality of drivers include first drivers for activating the first sub-word lines in response to a predetermined change in the first clock when a corresponding one of the plurality of main word lines is active, and second drivers for activating the second sub-word lines in response to a predetermined change in the second clock when a corresponding one of the plurality of main word lines is active.

A fourth aspect of the present invention is intended for a method of reading data from a synchronous memory device, the synchronous memory device including a plurality of main word lines and a plurality of sub-word lines connected to memory cells, the synchronous memory device reading data in synchronism with at least one clock. According to the present invention, the method comprises the steps of: selectively activating the plurality of main word lines prior to a predetermined change in the at least one clock; putting a plurality of drivers connected to an activated one of the plurality of main word lines for activating some of the plurality of sub-word lines which correspond to the activated main word line into operation in response to the predetermined change in the at least one clock after the step of activating the plurality of main word lines; and reading data from some of the memory cells connected to the activated sub-word lines.

Preferably, according to a fifth aspect of the present invention, the at least one clock includes first and second clocks different from each other; the plurality of sub-word lines include first sub-word lines permitted to be activated by first drivers and second sub-word lines permitted to be activated by second drivers at the same time when a corresponding one of the plurality of main word lines is active; and the first and second drivers activate the first and second sub-word lines in response to the first and second clocks, respectively, in the step of activating the plurality of sub-word lines.

In accordance with the synchronous memory device of the first aspect of the present invention, the address decoder activates the main word lines to previously select the drivers, and the clock is directly applied to the drivers for driving the sub-word lines to control the timing of the activation of the sub-word lines. Therefore, the access time between the predetermined change in the clock and the reading of data from the memory cells may be shortened.

In accordance with the synchronous memory device of the second aspect of the present invention, the first control signal controls the first drivers whereas the second control signal controls the second drivers. For example, only the first drivers or the second drivers may perform the write operation. The first and second drivers may be used also for write control, permitting the circuit size to be smaller than that of the conventional synchronous memory device which may control the write operation.

In accordance with the synchronous memory device of the third aspect of the present invention, the plurality of drivers are classified into the first drivers controlled by the first clock, and the second drivers controlled by the second clock, providing different timings of activation of the first and second sub-word lines. This achieves a wide application of the clock, such as the use of the clock for selection of the sub-word lines, and high speed reading of data, such as serial reading of data from the first and second sub-word lines.

In accordance with the method of reading data from a synchronous memory device in the fourth aspect of the present invention, the drivers activate the sub-word lines in response to the predetermined change in the clock after the main word lines are selectively activated. This is effective in shortening the access time between the predetermined change in the clock and the reading of data from the memory cells.

In accordance with the method of reading data from a synchronous memory device in the fifth aspect of the present invention, the plurality of drivers are classified into the first drivers controlled by the first clock and the second drivers controlled by the second clock, providing different timings of activation of the first and second sub-word lines. This achieves a wide application of the clock, such as the use of the clock for selection of the sub-word lines, and high speed reading of data, such as serial reading of data from the first and second sub-word lines.

It is therefore an object of the present invention to eliminate the time required for an address decoder to activate word lines to shorten access time.

It is another object of the present invention to reduce the size of a circuit in controlling the write operation for each group of bit lines classified.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
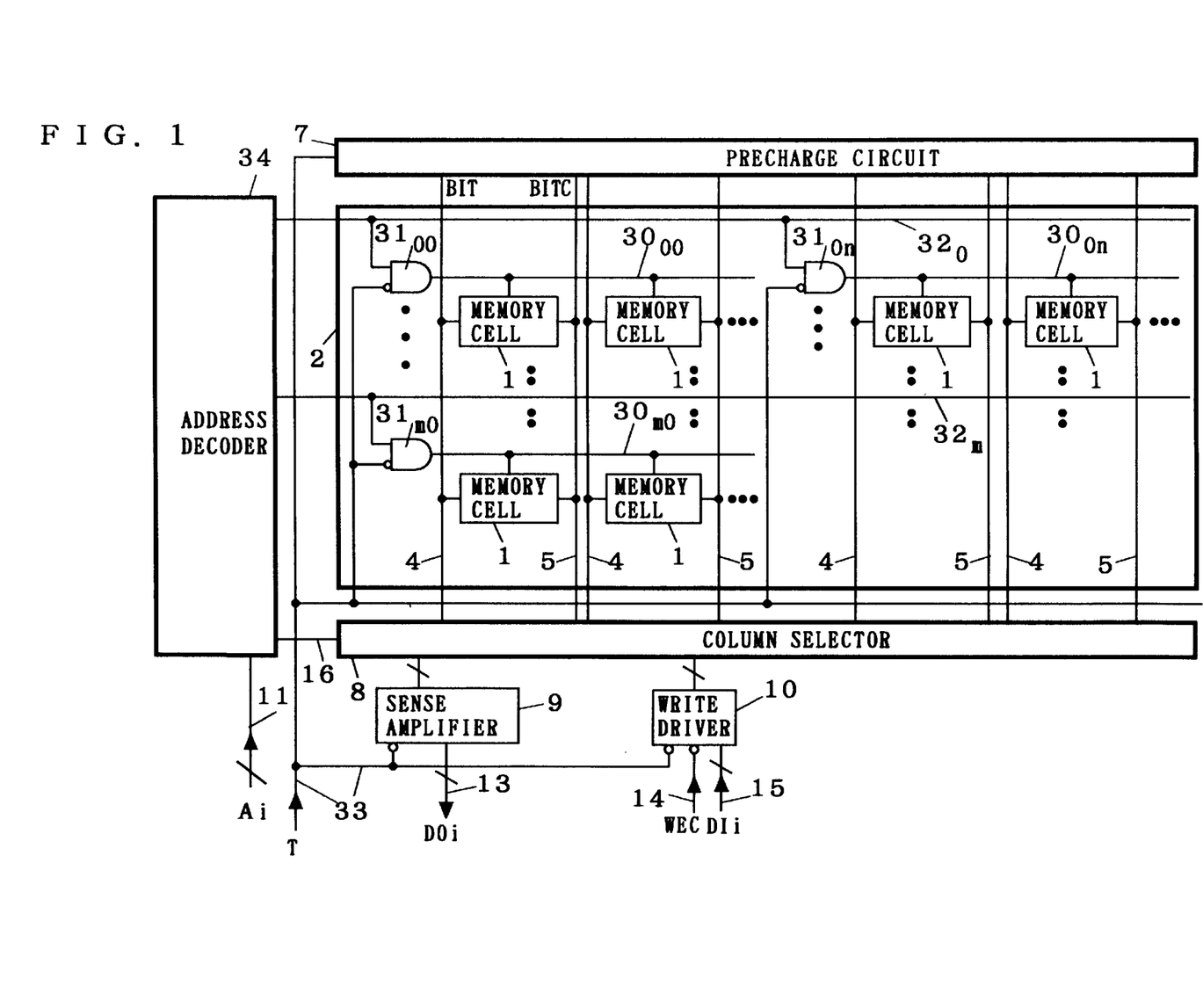
FIG. 1 is a block diagram showing principal portions of a synchronous RAM according to a first preferred embodiment of the present invention.

A synchronous memory device according to a first preferred embodiment of the present invention will now be described with reference to FIGS. 1, 2, and 3A through 3C. FIG. 1 is a block diagram showing principal portions of a synchronous RAM according to the first preferred embodiment of the present invention. In FIG. 1, the reference numeral 1 designates memory cells each for storing 1-bit data therein; 2 designates a memory plane in which a plurality of memory cells 1 are arranged; the reference characters $30_{00}$ to $30_{mn}$ designate sub-word lines connected to selecting pass transistors provided in the memory cells 1; $31_{00}$ to $31_{mn}$ designate drivers for activating the sub-word lines $30_{00}$ to $30_{mn}$; $32_0$ to $32_m$ designate main word lines connected to the drivers $31_{00}$ to $31_{mn}$ for selecting the drivers $31_{00}$ to $31_{mn}$; 34 designates an address decoder for decoding an address signal Ai to select the main word lines $32_0$ to $32_m$; 7 designates a precharge circuit for precharging bit lines 4 and 5; 8 designates a column selector for selecting a column of the memory cells 1 to be written or read in the memory plane 2; 9 designates a sense amplifier for reading data from the memory cell 1 selected by the address decoder 34 and the column selector 8; 10 designates a write driver for writing data into the memory cell 1 selected by the address decoder 34 and the column selector 8; 33 designates a signal line for feeding a clock T to the precharge circuit 7, the sense amplifier 9, the write driver 10, and the drivers $31_{00}$ to $31_{mn}$; 11 designates an address bus for transmitting the address signal Ai; 13 designates a data bus for outputting data DOi read by the sense amplifier 9; 14 designates a signal line for transmitting a write enable signal WEC; and 15 designates a data bus for transmitting data Dli to be written by the write driver 10.

The clock T is a clock used for synchronizing the synchronous RAM. The drivers $31_{00}$ to $31_{mn}$ are arranged in the form of a matrix with m rows and n columns. The high-order figure of the two-digit subscript of the reference characters represents the row of the matrix, and the low-order figure thereof represents the column of the matrix. The same is true for other preferred embodiments to be described below.

The background art address decoder 6 receives the clock T so that the operation of the address decoder 6 starts after the clock T falls. If the address decoder 6 activates the word lines $3_0$ to $3_m$ prior to the falling of the clock T, a faulty operation such that the data stored in the memory cells 1 are erased since the precharge circuit 7 precharges the bit lines 4 and 5.

Unlike the background art address decoder 6 shown in FIG. 10, the address decoder 34 is adapted such that the operation of the address decoder 34 is not controlled by the clock T. In the synchronous memory device of FIG. 1, the drivers $31_{00}$ to $31_{mn}$ are controlled by the clock T, and the activation of the sub-word lines $30_{00}$ to $30_{mn}$ is not determined only by the activation of the main word lines $32_0$ to $32_m$, and is not performed until the clock T falls. Therefore, previous decoding by the address decoder 34 causes no faulty operation.

Figure 2:
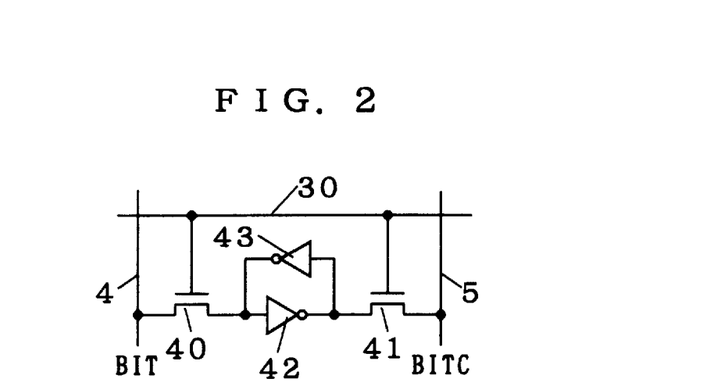
FIG. 2 is a circuit diagram of a memory cell for use in the synchronous RAM of FIG. 1.

FIG. 2 is a circuit diagram of the memory cell 1. The memory cell 1 comprises pass transistors 40 and 41 each having a gate connected to a sub-word line 30 where the sub-word line 30 indicates any one of the sub-word lines $30_{00}$ to $30_{mn}$ of FIG. 1. The pass transistors 40 and 41 have first current electrodes connected to the bit lines 4 and 5, respectively. A second current electrode of the pass transistor 40 is connected to an input terminal of an inverter 42, and a second current electrode of the pass transistor 41 is connected to an output terminal of the inverter 42. The input terminal of the inverter 42 is connected to an output terminal of an inverter 43, and the output terminal of the inverter 42 is connected to an input terminal of the inverter 43.

Figure 3A:
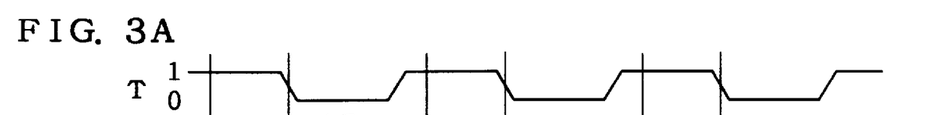
FIGS. 3A through 3C are a timing chart illustrating the operation of the synchronous RAM of FIG. 1.
Figure 3B:
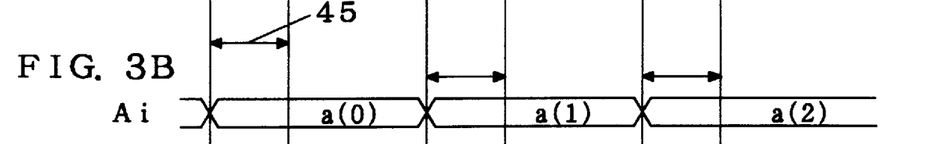
Figure 3C:
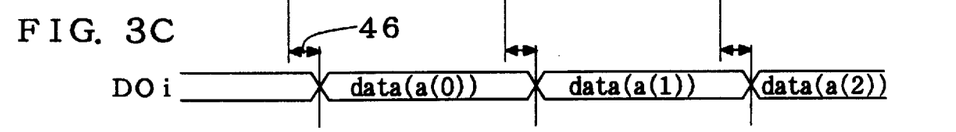

The operation of the synchronous RAM depicted in FIG. 1 is described with reference to FIGS. 3A through 3C. FIGS. 3A through 3C are a timing chart illustrating the read operation of the synchronous RAM according to the first preferred embodiment of the present invention. FIG. 3A illustrates the clock T, FIG. 3b illustrates the address signal Ai, and FIG. 3C illustrates the output data DOi.

The address signal Ai is fed in synchronism with the clock T and is set so that the setup time thereof is sufficient to activate the main word lines $32_0$ to $32_m$ prior to the falling of the clock T from "1" to "0". The setup time of the address signal Ai is indicated by the arrows 45 in FIG. 3B. At this period, the main word lines $32_0$ to $32_m$ are selectively activated by the address decoder 34.

The precharge circuit 7 charges the bit lines 4 and 5 up to the high level while the clock T is "1" to set signals BIT and BITC to "1".

When the clock T falls to "0", some of the drivers $31_{00}$ to $31_{mn}$ which are connected to the activated one of the main word lines $32_0$ to $32_m$ activate the corresponding sub-word lines by using their outputs. For example, if the main word line $32_0$ is activated, the drivers $31_{00}$ to $31_{0n}$ connected to the main word line $32_0$ activate the sub-word lines $30_{00}$ to $30_{0n}$. In this manner, the main word lines $32_0$ to $32_m$ are already activated prior to the falling of the clock T to be fed to the drivers $31_{00}$ to $31_{mn}$. Thus, the delay time between the falling of the clock T and the activation of one of the sub-word lines $30_{00}$ to $30_{mn}$ equals the response time of the drivers $31_{00}$ to $31_{mn}$ to the change in the clock T. The operation of the drivers $31_{00}$ to $31_{mn}$ each including an AND gate for providing the AND of the inverting input of the clock T and a signal on the corresponding one of the main word lines $32_0$ to $32_m$ is faster than that of the background art address decoder 6. Thus, the synchronous memory device of the first preferred embodiment of the present invention may require a shorter access time than the background art synchronous RAM which necessitates the operating time of the address decoder 6.

The data in the memory cells 1 in the row corresponding to the activated one of the main word lines $32_0$ to $32_m$ are outputted to the bit lines 4 and 5. The data DOi in one of the memory cells 1 in the row which is connected to the bit lines 4 and 5 selected by the column selector 8 are read. The clock T is transmitted to the column selector 8 to provide the read timing.

An access time which is the time from the falling of the clock T to the reading of the data DOi is indicated by the arrows 46 in FIG. 3C. The access time includes the time required for the drivers $31_{00}$ to $31_{mn}$ to activate the sub-word lines $30_{00}$ to $30_{mn}$, the time required for the column selector 8 to select the bit lines 4 and 5, and the operating time of the sense amplifier 9. The setup time is indicated by the arrows 45 in FIG. 3B. The setup time indicated by the arrows 45 is slightly longer than the background art setup time since the address signal Ai passes through the address decoder 34 but may fall within the time required for precharging. It is hence unnecessary to lower the frequency of the clock T.

Second Preferred Embodiment

A synchronous memory device according to a second preferred embodiment of the present invention will now be described with reference to FIGS. 4 through 7. In the synchronous memory device of the first preferred embodiment, the address decoder 34, the precharge circuit 7, and the column selector 8 are used for both read and write operations. The synchronous memory device of the second preferred embodiment is a synchronous memory device comprising memory cells having a plurality of ports, such as a synchronous multi-port RAM having one write only port and a plurality of read only ports.

Figure 4:
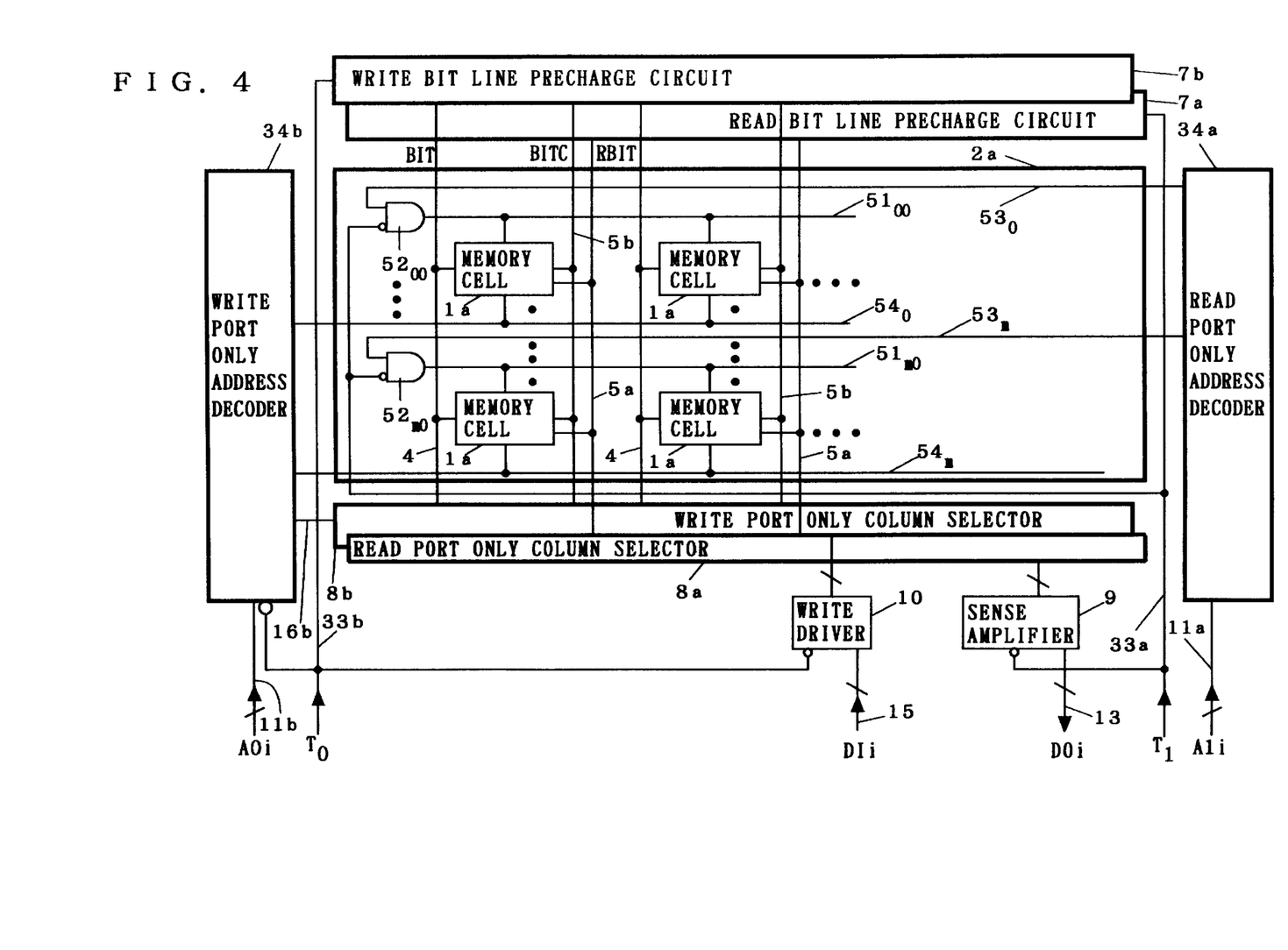
FIG. 4 is a block diagram showing principal portions of the synchronous RAM according to a second preferred embodiment of the present invention.

FIG. 4 is a block diagram of the synchronous RAM according to the second preferred embodiment of the present invention. In FIG. 4, the reference character 1a designates multi-port memory cells each having one write port and one read port and each for storing 1-bit data therein; 2a designates a memory plane wherein a plurality of memory cells 1a are arranged; $51_{00}$ to $51_{m0}$ designate sub-word lines connected to read only pass transistors provided in the memory cells 1a; $52_{00}$ to $52_{m0}$ designate read port only drivers for activating the sub-word lines $51_{00}$ to $51_{m0}$ in corresponding to rows, respectively; $53_0$ to $53_m$ designate read port only main word lines connected to the read port only drivers $52_{00}$ to $52_{m0}$ for selecting the read port only drivers $52_{00}$ to $52_{m0}$; $54_0$ to $54_m$ designate write port only word lines connected to write port only pass transistors provided in the memory cells 1a; 34a designates a read port only address decoder for decoding an address signal A1i to select the read port only main word lines $53_0$ to $53_m$; 34b designates a write port only address decoder for decoding an address signal AOi to select the write port only word lines $54_0$ to $54_m$; 7a designates a read bit line precharge circuit for precharging bit lines 5a; 7b designates a write bit line precharge circuit for precharging bit lines 4 and 5b; 8a designates a read port only column selector for selecting a column to be read among the columns of the memory cells 1a constituting the memory plane 2a; 8b designates a write port only column selector for selecting a column to be written among the columns of the memory cells 1a constituting the memory plane 2a; 9 designates a sense amplifier for reading data from the memory cell 1a selected by the read port only address decoder 34a and the read port only column selector 8a; 10 designates a write driver for writing data into the memory cell 1a selected by the write port only address decoder 34b and the write port only column selector 8b; 33a designates a signal line for feeding a clock $T_1$ to the precharge circuit 7a, the sense amplifier 9, and the drivers $52_{00}$ to $52_{m0}$; 33b designates a signal line for feeding a clock $T_0$ to the precharge circuit 7b and the write driver 10; 11a designates an address bus for transmitting the address signal A1i to the read port only address decoder 34a; 11b designates an address bus for transmitting the address signal A0i to the write port only address decoder 34b; 13 designates a data bus for outputting the data DOi read by the sense amplifier 9; and 15 designates a data bus for transmitting the data Dli to be written by the write driver 10.

Although not shown in FIG. 4, drivers $52_{00}$ to $52_{mn}$ and corresponding sub-word lines $51_{00}$ to $51_{mn}$ are arranged in the form of a matrix. In the second preferred embodiment, n sub-word lines are provided in corresponding relation to one main word line. For example, the sub-word lines $51_{m0}$ to $51_{mn}$ correspond to the main word line $53_m$.

The arrangement of the synchronous multi-port RAM constructed as above described for the write operation is similar to that of the background art synchronous RAM. The write operation of the synchronous multi-port RAM is similar to that of the background art synchronous RAM.

While the clock $T_1$, on the read only port is "1", the read bit line precharge circuit 7a charges up the read only bit lines 5a so that a signal RBIT on the read only bit lines 5a is "1". Prior to the falling of the clock $T_1$, the read port only address decoder 34a has already selected one of the read port only main word lines $53_0$ to $53_m$. As the clock $T_1$ falls, some of the drivers $52_{00}$ to $52_{mn}$ which are connected to the one selected read port only main word line activate the corresponding sub-word lines by using their outputs.

The data in the memory cells 1a are read out to the output of the read only port through the read only bit lines 5a, the read port only column selector 8a, and the sense amplifier 9.

In the read operation, as in the first preferred embodiment, the read access time is the time required to read data in response to the transmission of the falling of the clock $T_1$ to the input terminals of the drivers $52_{00}$ to $52_{mn}$ and is equal to the delay time provided in an output path extending from the drivers $52_{00}$ to $52_{mn}$ for driving the sub-word lines $51_{00}$ to $51_{mn}$ through the memory cells 1a, the read only bit lines 5a, the read port only column selector 8a, and the sense amplifier 9. The data in the memory cells 1a may be read at high speeds.

Figure 5:
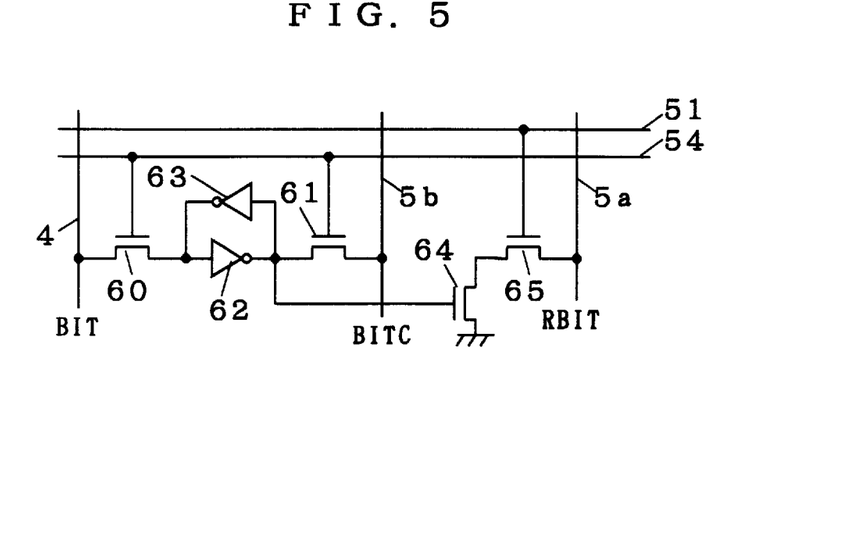
FIG. 5 is a circuit diagram of a memory cell for use in the synchronous RAM of FIG. 4.
Figure 6:
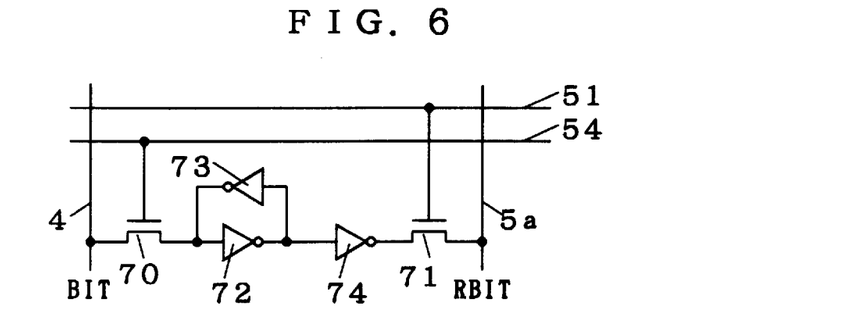
FIG. 6 is a circuit diagram of another memory cell for use in the second preferred embodiment.
Figure 7:
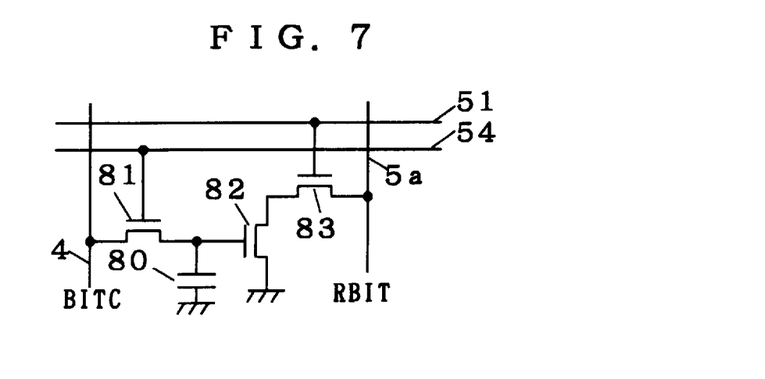
FIG. 7 is a circuit diagram of still another memory cell for use in the second preferred embodiment.

FIGS. 5 through 7 are circuit diagrams of different types of memory cells. The memory cells illustrated in FIGS. 5 through 7 have multi-ports. The reference numeral 51 in FIGS. 5 through 7 designates any one of the above described sub-word lines $51_{00}$ to $51_{mn}$. FIG. 5 is a circuit diagram of the memory cell used in the second preferred embodiment shown in FIG. 4. In FIG. 5, the reference numeral 60 designates a pass transistor having a first current electrode connected to the write only bit line 4, a gate connected to a write port only word line 54, and a second current electrode; 61 designates a pass transistor having a first current electrode connected to the write only bit line 5b, a gate connected to the write port only word line 54, and a second current electrode; 62 designates an inverter having an input terminal connected to the second current electrode of the pass transistor 60, and an output terminal connected to the second current electrode of the pass transistor 61; 63 designates an inverter having an input terminal connected to the output terminal of the inverter 62, and an output terminal connected to the input terminal of the inverter 62; 64 designates an NMOS transistor having a source grounded, a gate connected to the output terminal of the inverter 62, and a drain; and 65 designates an NMOS transistor having a source connected to the drain of the NMOS transistor 64, a gate connected to the read port only sub-word line 51, and a drain connected to the read only bit line 5a.

For the read operation, a driver 52 activates the read port only sub-word line 51 to turn on the pass transistor 65. The data stored in the memory cell of FIG. 5 are held by the inverters 62 and 63. Since the gate of the NMOS transistor 64 is connected to the output terminal of the inverter 62, the transistor 64 is on and the read only bit line 5a is low when the output from the inverter 62 is "1" (high). When the output from the inverter 62 is "0" (low), the read only bit line 5a which is precharged is high, and 1-bit data are read from the memory cell.

FIG. 6 is a circuit diagram of another memory cell for use in the second preferred embodiment. In FIG. 6, the reference numeral 70 designates a pass transistor having a first current electrode connected to the write only bit line 4, a gate connected to the write port only word line 54, and a second current electrode; 71 designates a pass transistor having a first current electrode connected to the read only bit line 5a, a gate connected to the read port only sub-word line 51, and a second current electrode; 72 designates an inverter having an input terminal connected to the second current electrode of the pass transistor 70, and an output terminal; 73 designates an inverter having an input terminal connected to the output terminal of the inverter 72, and an output terminal connected to the input terminal of the inverter 72; and 74 designates an inverter having an output terminal connected to the second current electrode of the pass transistor 71, and an input terminal connected to the output terminal of the inverter 72.

For the read operation from the memory cell of FIG. 6, the driver 52 activates the read port only sub-word line 51 to turn on the pass transistor 71. The data stored in the memory cell of FIG. 6 are held by the inverters 72 and 73. Since the output terminal of the inverter 74 is connected to the output terminal of the inverter 72, the inverter 74 outputs "0" (low level) to the read only bit line 5a when the output from the inverter 72 is "1" (high). When the output from the inverter 72 is "0" (low), the inverter 74 outputs "1" (high level) to the read only bit line 5a, and 1-bit data are read from the memory cell.

FIG. 7 is a circuit diagram of still another memory cell for use in the second preferred embodiment. In FIG. 7, the reference numeral 80 designates a capacitor having a first electrode grounded and a second electrode for holding data; 81 designates a pass transistor having a first current electrode connected to the write only bit line 4, a second current electrode connected to the second electrode of the capacitor 80, and a gate connected to the write port only word line 54; 82 designates an NMOS transistor having a source grounded, a gate connected to the second electrode of the capacitor 80, and a drain; and 83 designates a pass transistor having a first current electrode connected to the drain of the transistor 82, a gate connected to the read port only word line 51, and a second current electrode connected to the read only bit line 5a.

For the read operation from the memory cell of FIG. 7, the driver 52 activates the read port only sub-word line 51 to turn on the pass transistor 83. The data stored in the memory cell of FIG. 7 are held by the capacitor 80. Since the gate of the transistor 82 is connected to the second electrode of the capacitor 80, the transistor 82 turns on, and "0" (low level) is outputted to the read only bit line 5a when the output from the second electrode of the capacitor 80 is "1" (high). When the output from the second electrode of the capacitor 80 is "0" (low), the transistor 82 is off, and "1" (high level) is outputted to the read only bit line 5a that is precharged. Then, 1-bit data are read from the memory cell.

Third Preferred Embodiment

A synchronous memory device according to a third preferred embodiment of the present invention will now be described with reference to FIG. 8. In the synchronous memory device of the first preferred embodiment, one clock controls all of the drivers to read data from the memory cells. In the synchronous memory device of the third preferred embodiment, clock control is performed for each memory cell column driven by the sub-word lines to read data at high speeds by using different clocks.

Figure 8:
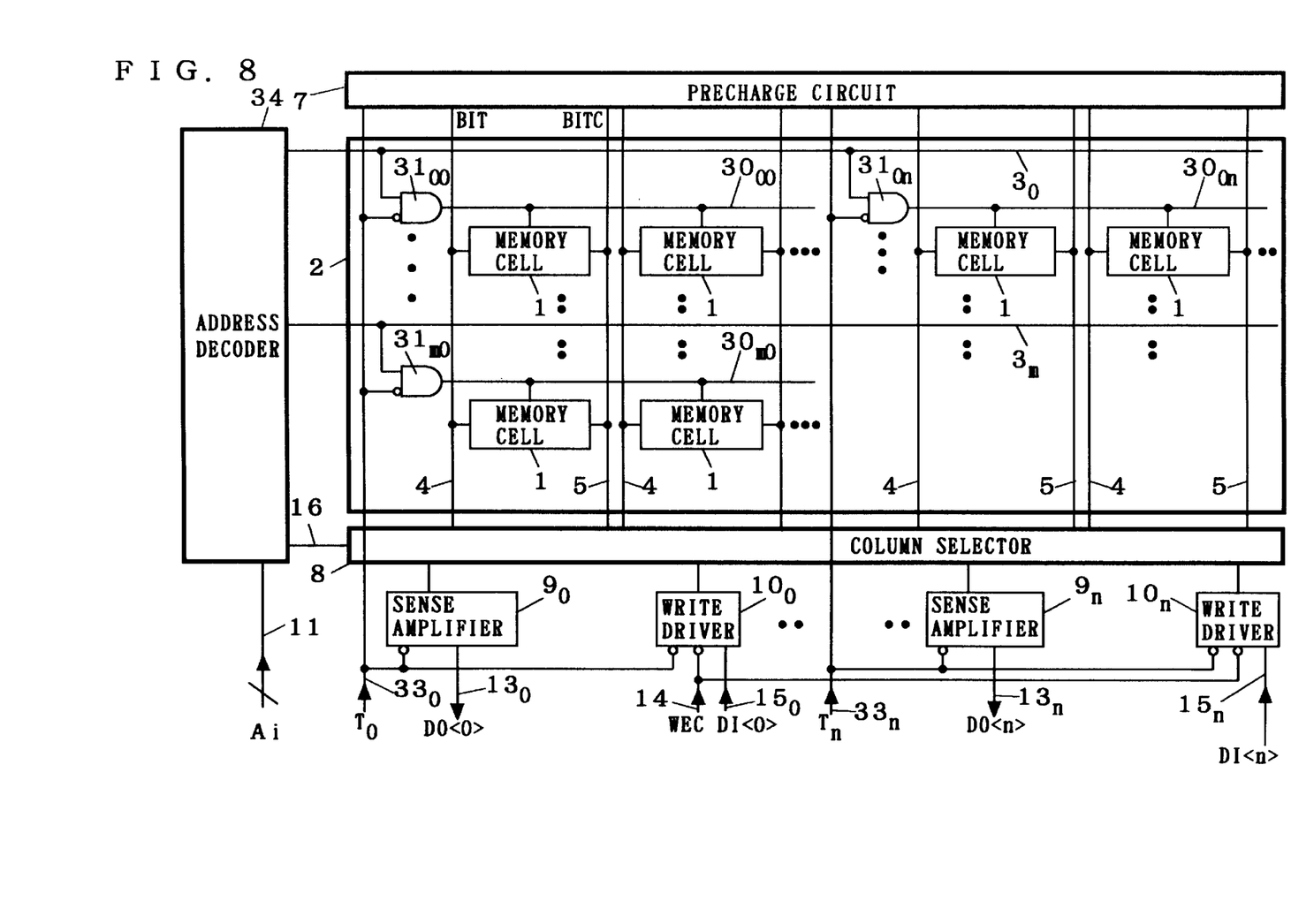
FIG. 8 is a block diagram showing principal portions of the synchronous RAM according to a third preferred embodiment of the present invention.

FIG. 8 is a block diagram of the synchronous RAM according to the third preferred embodiment of the present invention. In FIG. 8, the reference numeral 1 designates memory cells each for storing 1-bit data; 2 designates a memory plane wherein a plurality of memory cells 1 are arranged; the reference characters $30_{00}$ to $30_{0n}$ designate sub-word lines connected to selecting pass transistors provided in the memory cells 1; $31_{00}$ to $31_{0n}$ designate drivers for activating the sub-word lines $30_{00}$ to $30_{0n}$, respectively; $3_0$ to $3_m$ designate main word lines connected to the drivers $31_{00}$ to $31_{0n}$ in the corresponding rows for selecting the drivers $31_{00}$ to $31_{0n}$; 34 designates an address decoder for decoding the address signal Ai to select the main word lines $3_0$ to $3_m$; 7 designates a precharge circuit for precharging the bit lines 4 and 5; 8 designates a column selector for selecting a column of the memory cells 1 to be written or read in the memory plane 2; $9_0$ to $9_n$ designate sense amplifiers for reading data from the memory cell 1 which is selected by the address decoder 34 and the column selector 8 and selected by the corresponding one of the drivers $31_{00}$ to $31_{0n}$; $10_0$ to $10_n$ designate write drivers for writing data into the memory cell 1 which is selected by the address decoder 34 and the column selector 8 and selected by the corresponding one of the drivers $31_{00}$ to $31_{0n}$; $33_0$ to $33_n$ designate signal lines for feeding clocks $T_0$ to $T_n$ to the precharge circuit 7, the sense amplifiers $9_0$ to $9_n$, the write drivers $10_0$ to $10_n$, and the drivers $31_0$ to $31_n$; 11 designates an address bus for transmitting the address signal Ai; $13_0$ to $13_n$ designate signal lines for outputting data DO<0> to DO<n> read by the sense amplifiers $9_0$ to $9_n$, respectively; 14 designates a signal line for transmitting the write enable signal WEC; $15_0$ to $15_n$ designate data buses for transmitting data DI<0> to DI<n> to be written by the write drivers $10_0$ to $10_n$, respectively; and 16 designates a signal line for transmitting a signal indicative of operating timing from the address decoder 34 to the column selector 8. Although not shown in FIG. 8, the drivers $31_{00}$ to $31_{mn}$ and the corresponding sub-word lines $30_{00}$ to $30_{mn}$ are arranged in the form of a matrix. In the third preferred embodiment, n sub-word lines are provided in corresponding relation to one main word line. For example, the sub-word lines $30_{m0}$ to $30_{mn}$ correspond to the main word line $3_m$. Some portions with the subscript representing the low-order figure being 1 to n−1, such as the sub-word lines $30_{11}$ to $30_{mn-1}$ and drivers $31_{11}$ to $31_{mn-1}$, are not shown in FIG. 8.

The address signal Ai is fed in synchronism with the clocks $T_0$ to $T_n$ and is set so that the setup time thereof is sufficient to activate the main word lines $3_0$ to $3_m$ prior to the falling of each of the clocks $T_0$ to $T_n$ from "1" to "0".

One of the main word lines $3_0$ to $3_m$ is activated. When the clocks $T_0$ to $T_n$ fall, some of the drivers $31_{00}$ to $31_{mn}$ which are connected to the activated main word line output "1". For example, if the main word line $3_0$ is activated, the falling of the clock $T_0$ causes the drivers $31_{00}$ to $31_{0n}$ to activate the sub-word lines $30_{00}$ to $30_{0n}$. The clocks $T_0$ to $T_n$ illustrated in FIG. 8 slightly differ in phase with each other. For instance, the falling of the clock $T_n$ lags behind the falling of the clock $T_0$ by a phase difference Tθ. Accordingly, the driver $31_{0n}$ outputs "1" at a time later than does the driver $31_{00}$ by the time delay Tθ.

The column selector 8 is adapted to select one of the columns of the plurality of memory cells 1 connected to the sub-word lines $30_{00}$ to $30_{m0}$, respective one of the columns of the plurality of memory cells connected to the sub-word lines $30_{01}$–$30_{m1}$, $30_{02}$–$30_{m2}$, . . . , and $30_{0n-1}$–$30_{mn-1}$, and one of the columns of the plurality of memory cells connected to the sub-word lines $30_{0n}$ to $30_{mn}$.

The data stored in the selected memory cells 1 are detected by the corresponding sense amplifiers $9_0$ to $9_n$ and outputted as the data DO<0> to DO<n>. The output timings from the sense amplifiers $9_0$ to $9_n$ are shifted respectively by the times corresponding to the phase differences of the clocks $T_0$ to $T_n$. For example, the data DO<n> are outputted at a time later than the data DO<0> by the time delay Tθ.

For instance, when one of the memory cells driven by the sub-word lines in one column constitutes one bit, respective bits may be read using different clocks. The time difference may be utilized to output the data DO<0> to DO<n>, and the outputs may be switched by a multiplexer and the like, permitting all data to be serially outputted within one clock cycle.

When the data DO<0> to DO<n> are outputted with a time difference shorter than one clock cycle, the data DO<0> to DO<n> may be serially outputted in the one clock cycle. This provides effects similar to those obtained by reading data at high speeds by using a clock having a higher frequency than that of the clocks $T_0$ to $T_n$.

Additionally, any one of the clocks $T_0$ to $T_1$ may be stopped to selectively read only required data among the data DO<0> to DO<n>.

Fourth Preferred Embodiment

Figure 9:
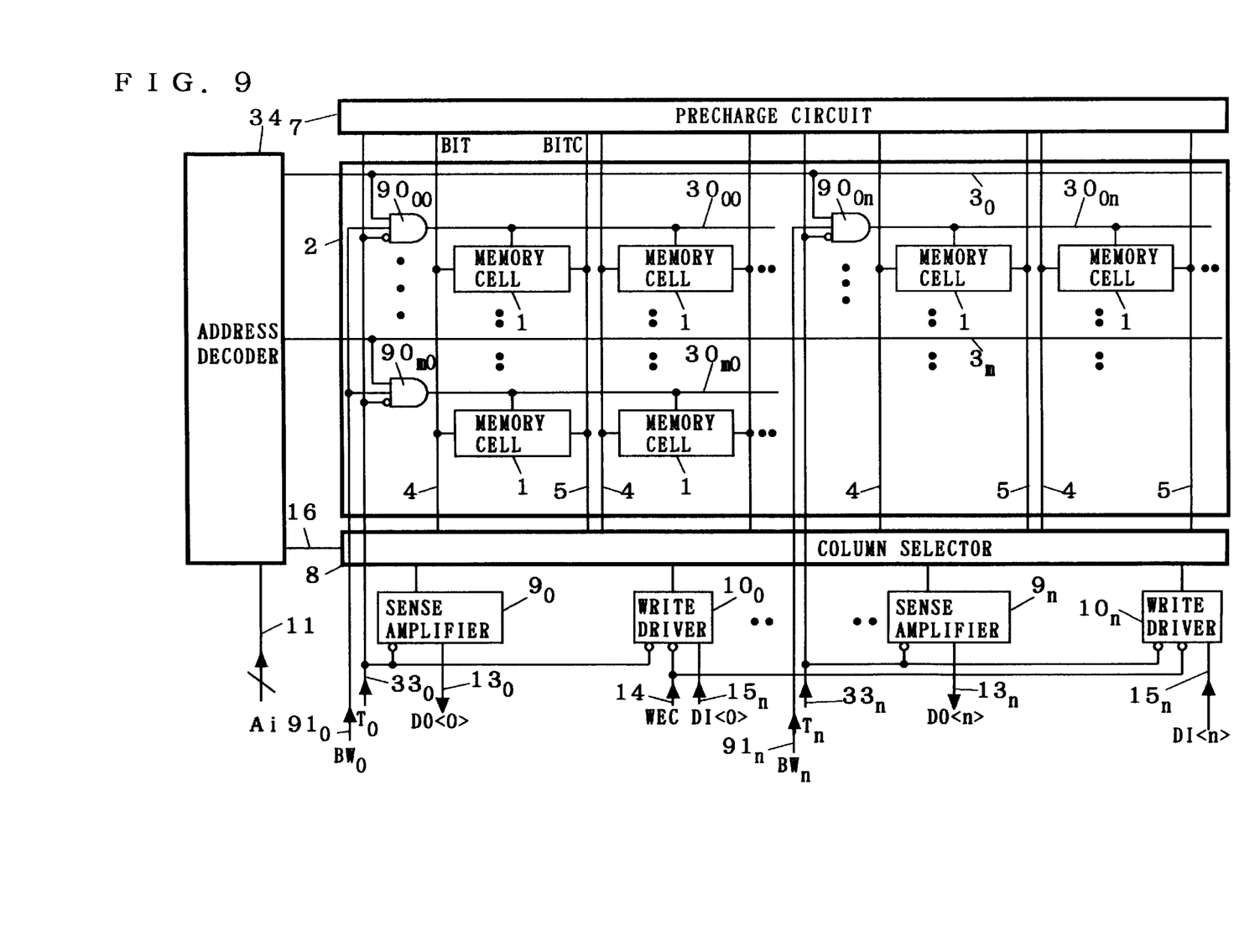
FIG. 9 is a block diagram showing principal portions of the synchronous RAM according to a fourth preferred embodiment of the present invention.

A synchronous memory device according to a fourth preferred embodiment of the present invention will now be described with reference to FIG. 9. FIG. 9 is a block diagram of the synchronous RAM according to the fourth preferred embodiment of the present invention. In FIG. 9, the reference numeral 1 designates memory cells each for storing 1-bit data therein; 2 designates a memory plane wherein a plurality of memory cells 1 are arranged; the reference characters $30_{00}$ to $30_{0n}$ designate sub-word lines connected to selecting pass transistors provided in the memory cells 1; $90_{00}$ to $90_{0n}$ designate drivers for activating the sub-word lines $30_{00}$ to $30_{0n}$, respectively; $3_0$ to $3_m$ designate main word lines connected to the drivers $90_{00}$ to $90_{0n}$ in the corresponding rows for selecting the drivers $90_{00}$, to $90_{0n}$;

34 designates an address decoder for decoding the address signal Ai for selecting the main word lines $3_0$ to $3_m$; 7 designates a precharge circuit for precharging the bit lines 4 and 5; 8 designates a column selector for selecting a column of the memory cells 1 to be written or read in the memory plane 2; $9_0$ to $9_n$ designate sense amplifiers for reading data from the memory cell 1 which is selected by the address decoder 34 and the column selector 8 and selected by the corresponding one of the drivers $90_{00}$ to $90_{0n}$; $10_0$ to $10_n$ designate write drivers for writing data into the memory cell 1 which is selected by the address decoder 34 and the column selector 8 and selected by the corresponding one of the drivers $90_{00}$ to $90_{0n}$; $33_{00}$ to $33_{0n}$ designate signal lines for feeding the clocks $T_0$ to $T_n$ to the precharge circuit 7, the sense amplifiers $9_0$ to $9_n$, the write drivers $10_0$ to $10_n$, and the drivers $90_{00}$ to $90_{0n}$; 11 designates an address bus for transmitting the address signal Ai; $13_0$ to $13_n$ designate signal lines for outputting the data DO<0> to DO<n> read by the sense amplifiers $9_0$ to $9_n$, respectively; 14 designates a signal line for transmitting the write enable signal WEC; $15_0$ to $15_n$ designate data bus for transmitting the data DI<0> to DI<n> to be written by the write drivers $10_0$ to $10_n$, respectively; 16 designates a signal line for transmitting a signal indicative of the operating timing from the address decoder 34 to the column selector 8; and $91_0$ to $91_n$ designate signal lines for transmitting control signals $BW_0$ to $BW_n$ for controlling the write operation to the drivers $90_{00}$ to $90_{mn}$. Although not shown in FIG. 9, the drivers $90_{00}$ to $90_{mn}$ and corresponding sub-word lines $30_{00}$ to $30_{mn}$ are arranged in the form of a matrix. In the fourth preferred embodiment, n sub-word lines are provided in corresponding relation to one main word line. For example, the sub-word lines $30_{m0}$ to $30_{mn}$ correspond to the main word line $3_m$. Some portions with the subscript representing the low-order figure being 1 to n−1, such as the sub-word lines $30_1$ to $30_{n-1}$ and drivers $90_1$ to $90_{n-1}$, are not shown in FIG. 9.

The synchronous RAM according to the fourth preferred embodiment shown in FIG. 9 differs to the synchronous RAM of the third preferred embodiment shown in FIG. 8 in that the drivers $90_{00}$ to $90_{mn}$ are controlled by the control signals $BW_0$ to $BW_n$.

The synchronous RAM of FIG. 9 is similar in operation to the synchronous RAM of the third preferred embodiment shown in FIG. 8 in the read operation when the control signals $BW_0$ to $BW_n$ are set to "1".

In the write operation, the control signals $BW_0$ to $BW_n$ control the drivers $90_{00}$ to $90_{mn}$, and only some of the sub-word lines $30_{00}$ to $30_{mn}$ which correspond to at least one of the control signals $BW_0$ to $BW_n$ which is set to "1" may be activated. Data may be written into the memory cells connected to some of the word lines $30_{00}$ to $30_{mn}$ which are permitted to be activated by the control signals $BW_0$ to $BW_n$. For instance, some memory cells driven by the sub-word lines $30_{00}$ to $30_{mn}$ constitute (n+1)-bit data, write control may be performed for each bit of the data. This suppresses the increase in circuit size resulting from the changes in construction of the write drivers $10_0$ to $10_n$ which have been made in the background art. For example, when the memory cells in one column associated with the sub-word lines $30_{00}$ to $30_{m0}$ correspond to the most significant bit, the control signal $BW_0$ should be set to "1", with the control signals $BW_1$ to $BW_n$ being set to "0", in order to rewrite only the most significant bit.

While the invention has been described in detail, the foregoing description is in all aspects illustrative and not restrictive. It is understood that numerous other modifications and variations can be devised without departing from the scope of the invention.

I claim:
1. A synchronous memory device comprising:
an address decoder for decoding an address signal prior to a predetermined change in at least one clock;
a plurality of main word lines selectively activated in accordance with a result of decoding of the address signal by said address decoder;
a plurality of sub-word lines corresponding to said plurality of main word lines and connected to a plurality of memory cells for controlling reading of data from said plurality of memory cells; and
a plurality of drivers corresponding respectively to said plurality of sub-word lines for activating corresponding ones of said plurality of sub-word lines in response to said predetermined change in said at least one clock when a corresponding one of said plurality of main word lines is active.

2. The synchronous memory device of claim 1,
wherein said plurality of sub-word lines include first and second sub-word lines permitted to be activated simultaneously when a corresponding one of said plurality of main word lines is active, and
wherein said plurality of drivers include
first drivers for activating said first sub-word lines in response to said predetermined change in said at least one clock when said first drivers are operable in response to a first control signal and a corresponding one of said plurality of main word lines is active, and
second drivers for activating said second sub-word lines in response to said predetermined change in said at least one clock when said second drivers are operable in response to a second control signal and a corresponding one of said plurality of main word lines is active.

3. The synchronous memory device of claim 1,
wherein said at least one clock includes first and second clocks different from each other,
wherein said plurality of sub-word lines includes first and second sub-word lines permitted to be activated simultaneously when a corresponding one of said plurality of main word lines is activated, and
wherein said plurality of drivers include
first drivers for activating said first sub-word lines in response to a predetermined change in said first clock when a corresponding one of said plurality of main word lines is active, and
second drivers for activating said second sub-word lines in response to a predetermined change in said second clock when a corresponding one of said plurality of main word lines is active.

4. The synchronous memory device of claim 3,
wherein said plurality of sub-word lines include first and second sub-word lines permitted to be activated simultaneously when a corresponding one of said plurality of main word lines is active, and
wherein said plurality of drivers include
first drivers for activating said first sub-word lines in response to said predetermined change in said at least one clock when said first drivers are operable in response to a first control signal and a corresponding one of said plurality of main word lines is active, and
second drivers for activating said second sub-word lines in response to said predetermined change in said at least one clock when said second drivers are operable in response to a second control signal and a corresponding one of said plurality of main word lines is active.

5. A method of reading data from a synchronous memory device, said synchronous memory device including a plurality of main word lines and a plurality of sub-word lines connected to memory cells, said synchronous memory device reading data in synchronism with at least one clock, said method comprising the steps of:

selectively activating said plurality of main word lines prior to a predetermined change in said at least one clock;

putting a plurality of drivers connected to an activated one of said plurality of main word lines for activating some of said plurality of sub-word lines which correspond to said activated main word line into operation in response to said predetermined change in said at least one clock after said step of activating said plurality of main word lines; and reading data from some of said memory cells connected to said activated sub-word lines.

6. The method of claim 5, wherein said at least one clock includes first and second clocks different from each other, wherein said plurality of sub-word lines include first sub-word lines permitted to be activated by first drivers and second sub-word lines permitted to be activated by second drivers at the same time when a corresponding one of said plurality of main word lines is active, and wherein said first and second drivers activate said first and second sub-word lines in response to said first and second clocks, respectively, in said step of activating said plurality of sub-word lines.

* * * * *